(12) United States Patent
Akondy et al.

(10) Patent No.: US 10,763,831 B2
(45) Date of Patent: Sep. 1, 2020

(54) GENERATION OF PULSE WIDTH MODULATED (PWM) PULSES

(71) Applicant: TEXAS INSTRUMENTS INCORPORATED, Dallas, TX (US)

(72) Inventors: Subrahmanya Bharathi Akondy, Cypress, TX (US); Nirav Ginwala, Sugar Land, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/209,615

(22) Filed: Dec. 4, 2018

(65) Prior Publication Data

US 2020/0177169 A1 Jun. 4, 2020

(51) Int. Cl.
*H03K 3/017* (2006.01)
*H03K 7/08* (2006.01)
*H03K 5/04* (2006.01)

(52) U.S. Cl.
CPC ............... *H03K 3/017* (2013.01); *H03K 5/04* (2013.01); *H03K 7/08* (2013.01)

(58) Field of Classification Search
CPC ............. H03K 3/017; H03K 5/04; H03K 7/08
See application file for complete search history.

(56) References Cited

U.S. PATENT DOCUMENTS

| 7,301,417 | B2* | 11/2007 | Shinohara | ............... | H03F 3/217 327/172 |
| 7,554,373 | B2* | 6/2009 | Fujino | ..................... | H03K 7/08 327/175 |
| 8,373,482 | B2* | 2/2013 | Sabapathy | ............... | G01K 7/01 327/172 |
| 8,477,054 | B2* | 7/2013 | Scheytt | .................... | H03K 7/08 341/143 |

* cited by examiner

*Primary Examiner* — Patrick O Neill
(74) *Attorney, Agent, or Firm* — Ebby Abraham; Charles A. Brill; Frank D. Cimino

(57) ABSTRACT

A circuit includes a base pulse generator to generate a first pulse width modulated (PWM) pulse, a first clock generation circuit to generate M clocks of a first frequency and phase-shifted with respect to each other, and a second clock generation circuit to receive the M clocks and to generate N clocks each at a second lower frequency and the M clocks are phase-shifted with respect to each other. Each of a plurality of flip-flops includes a clock input to receive a different one of the N clocks, a data input coupled to receive the first PWM pulse, and a flip-flop output. A selection circuit includes a plurality of inputs and a selection circuit output. Each of the plurality of inputs is coupled to a corresponding flip-flop output. The selection circuit provides, responsive to a control signal, a selected one of the flip-flop outputs as the selection circuit output.

23 Claims, 5 Drawing Sheets

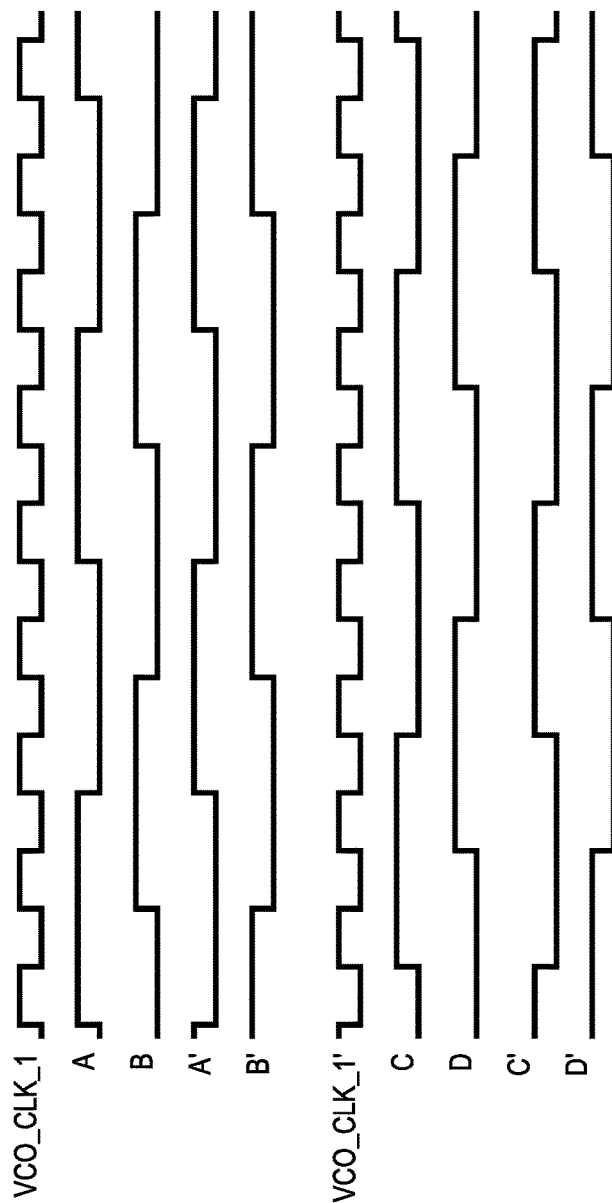
FIG. 5
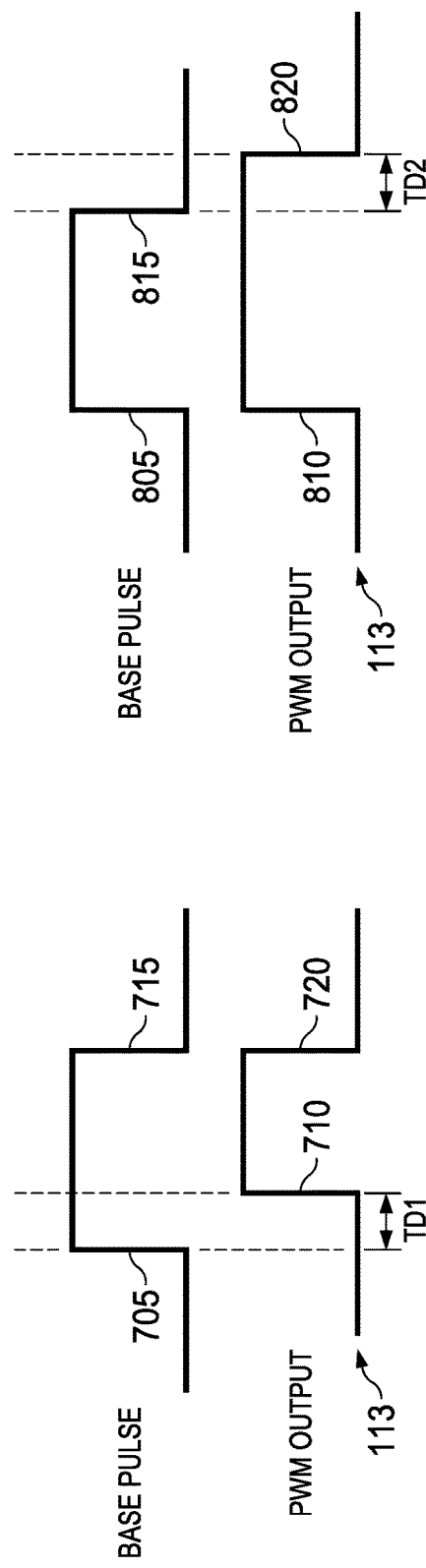
FIG. 8
FIG. 7

GENERATION OF PULSE WIDTH MODULATED (PWM) PULSES

BACKGROUND

Numerous applications use pulse width modulated (PWM) signals. For example, a buck converter voltage regulator uses PWM signals to control the duty cycle for which high and low side power transistors are turned on and off to produce a desired level for an output voltage. Some applications benefit from relatively high-resolution control as to when each rising edge and each falling edge of a given PWM pulse occur.

SUMMARY

In some implementations, a circuit includes a base pulse generator to generate a first pulse width modulated (PWM) pulse, a first clock generation circuit to generate M clocks of a first frequency and phase-shifted with respect to each other, and a second clock generation circuit to receive the M clocks and to generate N clocks at a second lower frequency. The M clocks are phase-shifted with respect to each other. Each of a plurality of flip-flops includes a clock input to receive a different one of the N clocks, a data input to receive the first PWM pulse, and a flip-flop output. A selection circuit includes a plurality of inputs and a selection circuit output. Each of the plurality of inputs is coupled to a corresponding flip-flop output. The selection circuit provides, responsive to a control signal, a selected one of the flip-flop outputs as the selection circuit output to form an output PWM pulse.

BRIEF DESCRIPTION OF THE DRAWINGS

For a detailed description of various examples, reference will now be made to the accompanying drawings in which:

FIG. 5 is a timing diagram illustrating the timing relationship between one of the input clocks and the larger number of phase-delayed clocks generated using that input clock.

FIG. 7 shows how the width of an output pulse can be reduced relative to the width of a base pulse.

FIG. 8 shows how the width of the output pulse can be stretched relative to the width of the base pulse.

DETAILED DESCRIPTION

This disclosure describes examples in which a first set of clocks are used to generate a second set of clocks. Each of the first set of clocks has the same frequency but the first set of clocks are phase-shifted with respect to each other. The second set of clocks are larger in number than the first set of clocks. Each of the second set of clocks also has a common frequency, but the second set of clocks are phase-shifted with respect to each other. The frequency of the second set of clocks is smaller than the frequency of the first set of clocks. The phase-shift between the clocks of the second set is smaller than the phase-shift between the clocks of the first set. A base PWM generator generates a base PWM pulse. A circuit is described below that receives the base PWM pulse and that uses one or more of the second set of clocks base to generate an output PWM pulse that has a width that is either (a) the same as the base PWM pulse, (b) narrower than the width of the base PWM pulse, or (c) wider than the width of the base PWM pulse. A central processing unit (CPU) core can specify when the rising and/or falling edges of the output PWM pulse should occur to thereby dictate the width of the output PWM pulse.

Figures 1, 2:
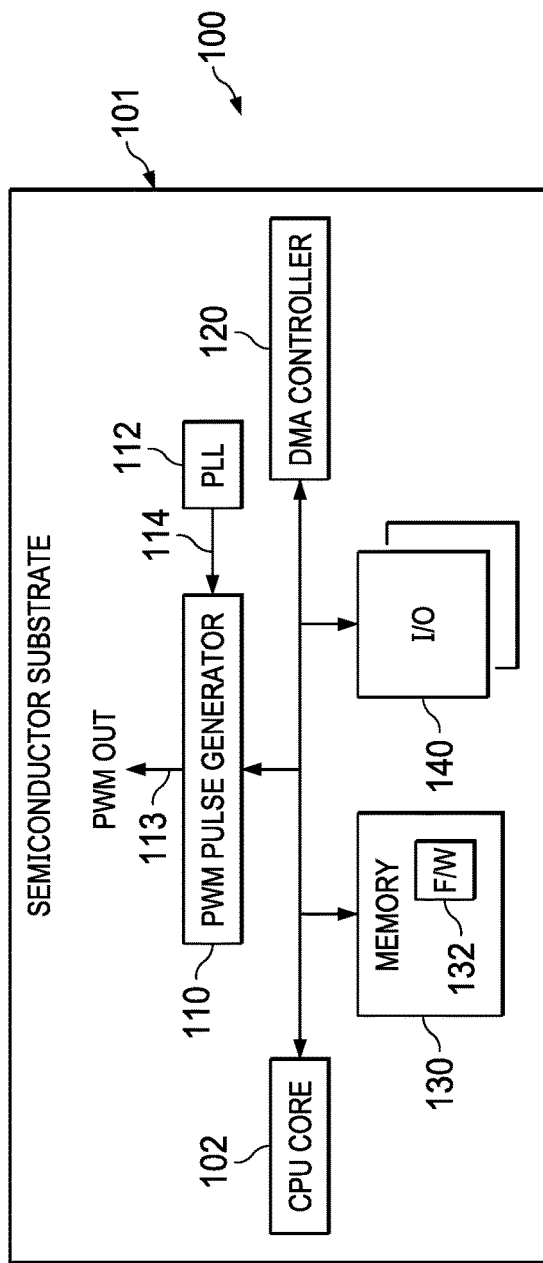
FIG. 1 illustrates a system including a pulse width modulated (PWM) pulse generator in accordance with an example.
FIG. 2 includes an example of phase-locked loop usable in the system of FIG. 1.

FIG. 1 shows a system 100 in accordance with the disclosed examples. In the example of FIG. 1, the system 100 comprises a system-on-chip (SoC) that includes a semiconductor substrate 101 on which a CPU core 102, PWM pulse generator 110, a phase-locked loop (PLL) 112, a direct memory access (DMA) controller 120, memory 130, and one or more input/output (I/O) devices 140 are formed. The memory 130 (or memory external to the semiconductor substrate 101) includes firmware (F/W) 132, which comprises instructions that are executable by the CPU core 102. The CPU core 102 may be a single core, or multiple CPU cores 102 may be included. If multiple CPU cores 102 are present, each core can execute some or all of the firmware 132. That is, the firmware 132 may be fully executed by each of multiple cores or distributed across multiple cores. The DMA controller 120 can effectuate a block transfer of data from, for example, one area of memory starting at one address to a different area of memory starting at a different address. The CPU core 102 programs the DMA controller 120 to initiate the data transfer but the DMA controller causes the data transfer to occur without further involvement by the CPU core 102. Each I/O device may comprise a port (e.g., Ethernet) or other type of peripheral device.

The PWM pulse generator 110 is programmed by the CPU core 102 to generate a series of PWM output pulses (PWM output 113). The CPU core 102 provides one or more configuration parameters to the PWM pulse generator 110. The configuration parameters indicate the frequency of the PWM pulses and the width of each pulse. As explained below, the PWM pulse generator 110 generates the requested PWM pulses using multiple clock signals 114 from PLL 112. The clock signals 114 from PLL 112 represent the first set of clock signals mentioned above. The second set of clocks are generated internally within the PWM pulse generator 110. The frequency of clocks 114 is generally substantially higher than the frequency of the second set of clocks. While PLL 112 is used to generate the higher frequency clocks 114 for use by the PWM pulse generator 110 in the example of FIG. 1, other sources of higher frequency clocks can be used in other examples.

FIG. 2 shows an example of PLL 112 which includes a phase and frequency detector (PFD) 202, a charge pump and loop filter 204, a voltage-controlled oscillator (VCO) 206, and a frequency divider 210. The VCO 206 generates an output clock (CLK_OUT) that, in addition to being an output clock from the PLL, is also provided back to an input of PFD 202. A reference clock (REF_CLOCK) also is provided to PFD 202 through, in this example, frequency divider 210. If the frequency of CLK_OUT is greater than REF_CLOCK (e.g., CLK_OUT being ten times the frequency of REF_CLOCK), the frequency divider 210 is included to divide down CLK_OUT to produce a feedback clock (FB_CLK)) that is of the same frequency as REF_CLOCK. If the frequency of CLK_OUT is the same as the frequency of REF_CLOCK, a frequency divider is not used. PFD 202 generates an error signal (ERR) 203 that encodes whether FB_CLK leads or lags REF_CLOCK. Charge pump and filter 204 includes a charge pump and a low pass filter and generates a filtered voltage to VCO 206 to cause the VCO 206 to slightly adjust the phase or frequency of CLK_OUT. The feedback control of PLL 112 causes CLK_OUT to maintain phase-lock with REF_CLOCK.

In this example, VCO 206 includes a ring oscillator 208 to generate CLK_OUT. Ring oscillator 208 includes an odd-number of inverters connected in series in a ring configuration. In this example, ring oscillator 208 includes three inverters 208a, 208b, and 208c but can include 5, 7, 9, etc. inverters in other implementations. The frequency of oscillation of the output of each inverters 208a-c is a function of the number of inverters in the ring and the propagation delay through each inverter. The output of each inverter 208a, 208b, and 208c is tapped to provide a VCO clock output signal. The output of inverter 208a is labeled VCO_CLK_1. The output of inverter 208b is labeled VCO_CLK_2. The output of inverter 208c is labeled VCO_CLK_3. These three clocks are of equal frequency but phase shifted from each other due to the propagation delay of each inverter. That is, VCO_CLK_2 is time-delayed from VCO_CLK_1 by amount of time equal to the propagation delay through inverter 208a. Similarly, VCO_CLK_3 is time-delayed from VCO_CLK_2 by amount of time equal to the propagation delay through inverter 208b, and VCO_CLK_1 is time-delayed from VCO_CLK_3 by amount of time equal to the propagation delay through inverter 208c.

Figure 3:
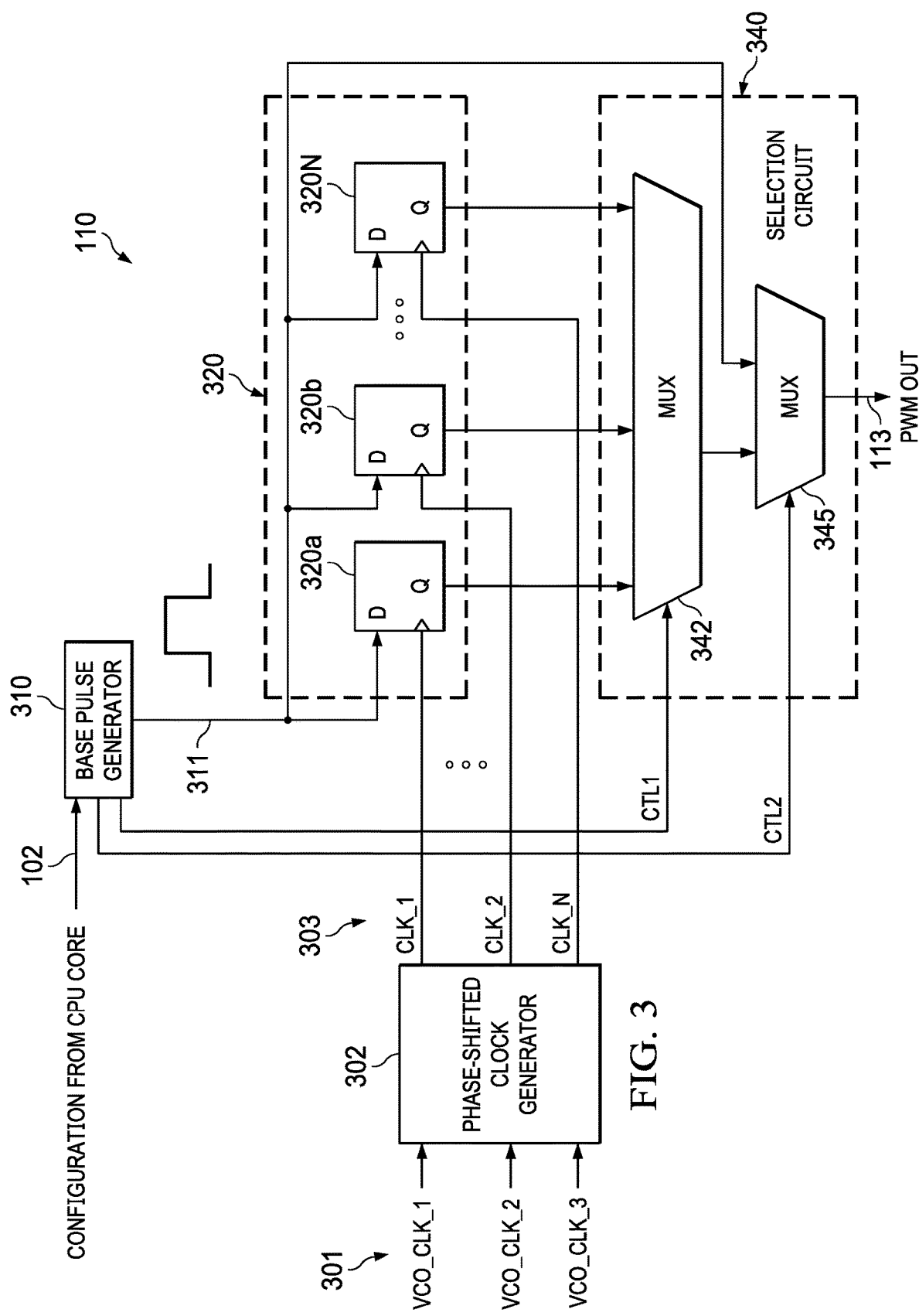
FIG. 3 is a schematic of the PWM pulse generator of FIG. 1.
Figure 4:
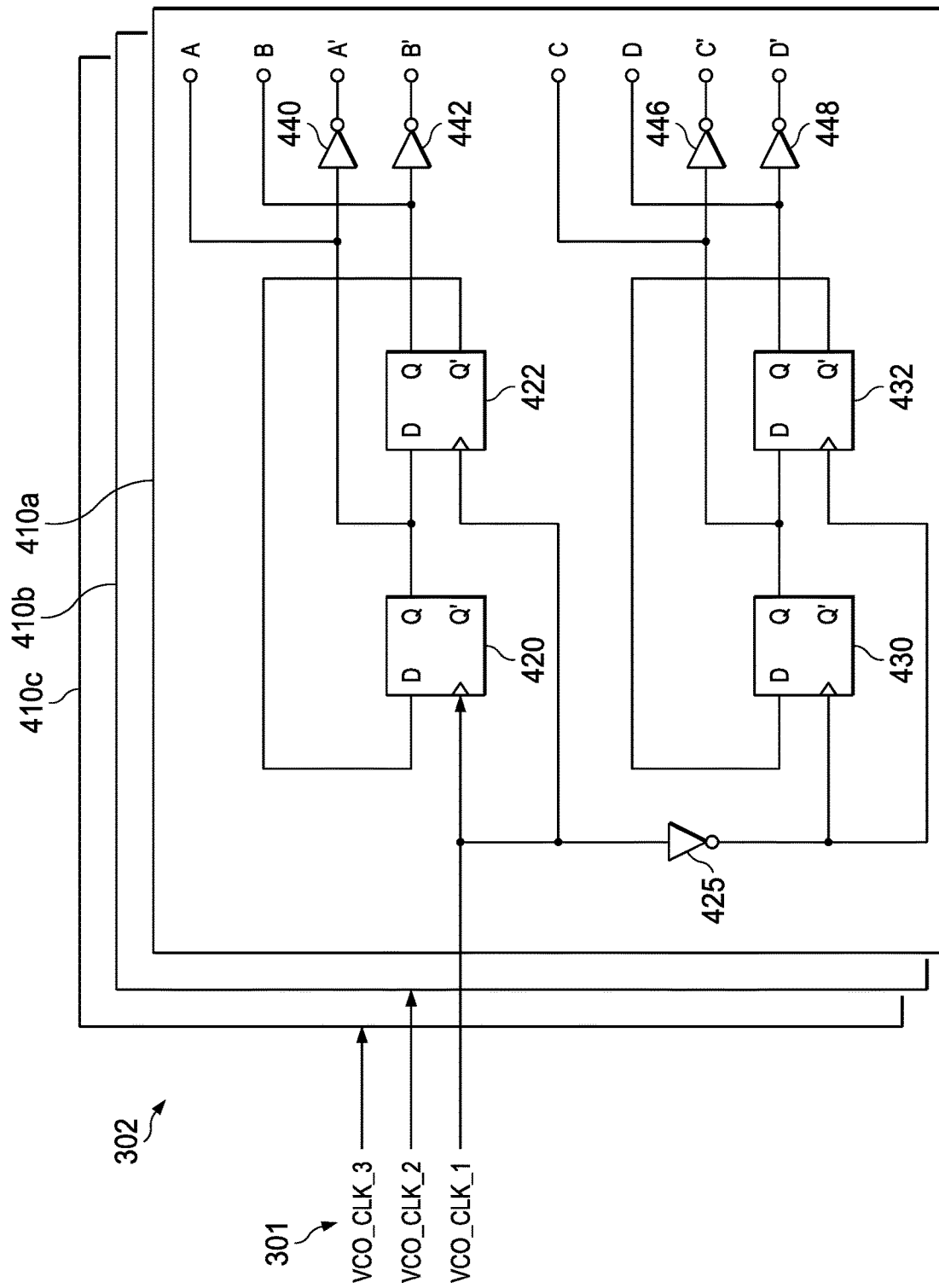
FIG. 4 is a schematic of a circuit for generating a larger number of phase-delayed clocks based on fewer number of input clocks.

FIG. 3 shows an example block diagram of PWM pulse generator 110. In this example, the PWM pulse generator 110 includes a phase-shifted clock generator 302, a base pulse generator 310, a plurality of flip-flops 320, and a selection circuit 340. As shown at 301, the phase-shifted clock generator 302 receives M VCO clocks and, based on those M clocks generates N clocks 303 shown as CLK_1, CLK_2, . . . , CLK_N. N is greater than M and in one example N is at least twice M. In the example of FIG. 3, M is 3 and includes clocks VCO_CLK_1, VCO_CLK_2, and VCO_CLK_3. In one example, N is 24 meaning that the phase-shifted clock generator 302 generates 24 output clocks based on 3 input clocks. Each of the N clocks CLK_1–N has a frequency that is the same between the N clocks CLK_1–N, but is lower than the frequency of the clocks VCO_CLK_1, VCO_CLK_2, and VCO_CLK_3. The N clocks 303 are phase-shifted with respect to each other. In one example, the frequency of each of the N clocks 303 is less than half the frequency of the VCO clocks 301. In an example, the frequency of each of the N clocks 303 is one-fourth the frequency of each of the VCO clocks 301. An example implementation of the phase-shifted clock generator 302 is shown in FIG. 4 and described below.

Referring still to FIG. 3, the base pulse generator 310 is configurable by, for example, the CPU core 102 to generate pulses on output line 311 to the plurality of flip-flops 320. The CPU core 102 can program the base pulse generator 310 as for the frequency of the pulses on line 311 and their duty cycle. In one implementation, one or more registers can be written to by CPU core 102 to configure the base pulse generator 310.

The flip-flops 320 include flip-flops 320a, 320b, . . . , 302N—one flip-flop 320 for each of CLK_1–N. The output line 311 from the base pulse generator 310 is coupled to the data input (D) input of each of flip-flops 320. Each clock CLK_1–N couples to a clock input of a respective flip-flop 320. For example, CLK_1 is coupled to the clock input of flip-flop 320a, CLK_2 is coupled to the clock input of flip-flop 320b, and so on.

The selection circuit 340 includes a multiplexer 342 and a multiplexer 345. The Q outputs of the flip-flops 320 are provided to the inputs of multiplexer 342. The output of multiplexer 342 is coupled to one input of multiplexer 345 and the output line 311 (on which the base pulse from base generator 310 is provided) is coupled to another input of multiplexer 345. In this implementation, control signals CTL1 and CTL2 generated by base pulse generator 310 are provided to control inputs of multiplexer 342 and 345, respectively. By control of multiplexers 342 and 345, an output of any of the flip-flops 320 can be routed through the multiplexers as the PWM output 113. Alternatively, the base pulse generated by the base pulse generator 310 can be provided through multiplexer 345 while bypassing multiplexer 342 and flip-flops 320.

FIG. 4 shows an example of an implementation of phase-shifted clock generator 302. The example implementation includes circuits 410a, 410b, and 410c—each circuit 410a-c receives one of the VCO clocks 301. VCO_CLK_1 is provided to circuit 410a. VCO_CLK_2 is provided to circuit 410b. VCO_CLK_3 is provided to circuit 410c. In this example, the circuits 410-c are generally identical to each other, and thus only circuit 410a is shown in detail for convenience. Circuit 410a includes flip-flops 420, 422, 430, and 432 and inverters 425, 440, 442, 446 and 448.

The Q output of flip-flop 420 is coupled to the D input of flip-flop 422, and the Q' output (logical inverse of the Q output) of flip-flop 422 is coupled to the D input of flip-flop 420. Each of flip-flops 420 and 422 are clocked by VCO_CLK_1. The combination of flip-flops 420, 422 represents a frequency divider that divides the frequency of input clock VCO_CLK_1 by a factor of 4. That is the frequency of each of the output clocks A, B, A' and B' is one-fourth the frequency of VCO_CLK_1. Flip-flops 430 and 432 are similarly configured and also represent a frequency divider (factor of 4 in this example). Inverter 425 inverts VCO_CLK_1 and a complement of VCO_CLK_1 is thus used to clock flip-flops 430, 432.

Eight output clocks A, B, C, D and their complements A', B', C' and D' are generated based on one clock input, VCO_CLK_1. FIG. 5 shows an example of a timing diagram of the input clock VCO_CLK_1 and the eight output clocks A-D and A'-D'. The A clock is taken from the Q output of flip-flop 420. Inverter 440 generates the complement of A. The B clock is tapped from the Q output of flip-flop 422 and is phase delayed by one VCO_CLK_1 cycle from the A clock. Inverter 442 generates the complement of B. The C and D clocks are taken, respectively, from the Q outputs of flip-flops 430 and 432. Inverters 446 and 448 are used to generate the complements of C and D, respectively.

As can be seen in FIG. 5, the eight output clocks A-B and A'-D' have the same frequency, which is one-fourth the frequency of VCO_CLK_1. Further, each of the eight output clocks A-B and A'-D' are phase-delayed with respect to each other. The other two circuits 410b and 410c operate much the same way as circuit 410a but are based on a different input clock (VCO_CLK_2 and VCL_CLK_3). As VCO_CLK2 and VCO_CLK 3 are phase delayed with respect to each other and with respect to VCO_CLK_1, each of the eight output clocks A-D and A'-D' from circuits 410b and 410c are also phase-delayed with respect to their counterpart clocks in the other circuits. That is, output clock A from each of circuits 410a-c is phase-delayed from each of the other A output clocks. Further, the output clock B from each of circuits 410a-c is phase-delayed from each of the other B output clocks, and so on. As each circuit 410-c generates 8 output clocks A-D and A'-D' from a single input clock, the collection of circuits 410a-410c generate 24 output clocks based on the three input clocks VCO_CLK_1, VCO_CLK_2, and VCO_CLK_3.

Figure 6:
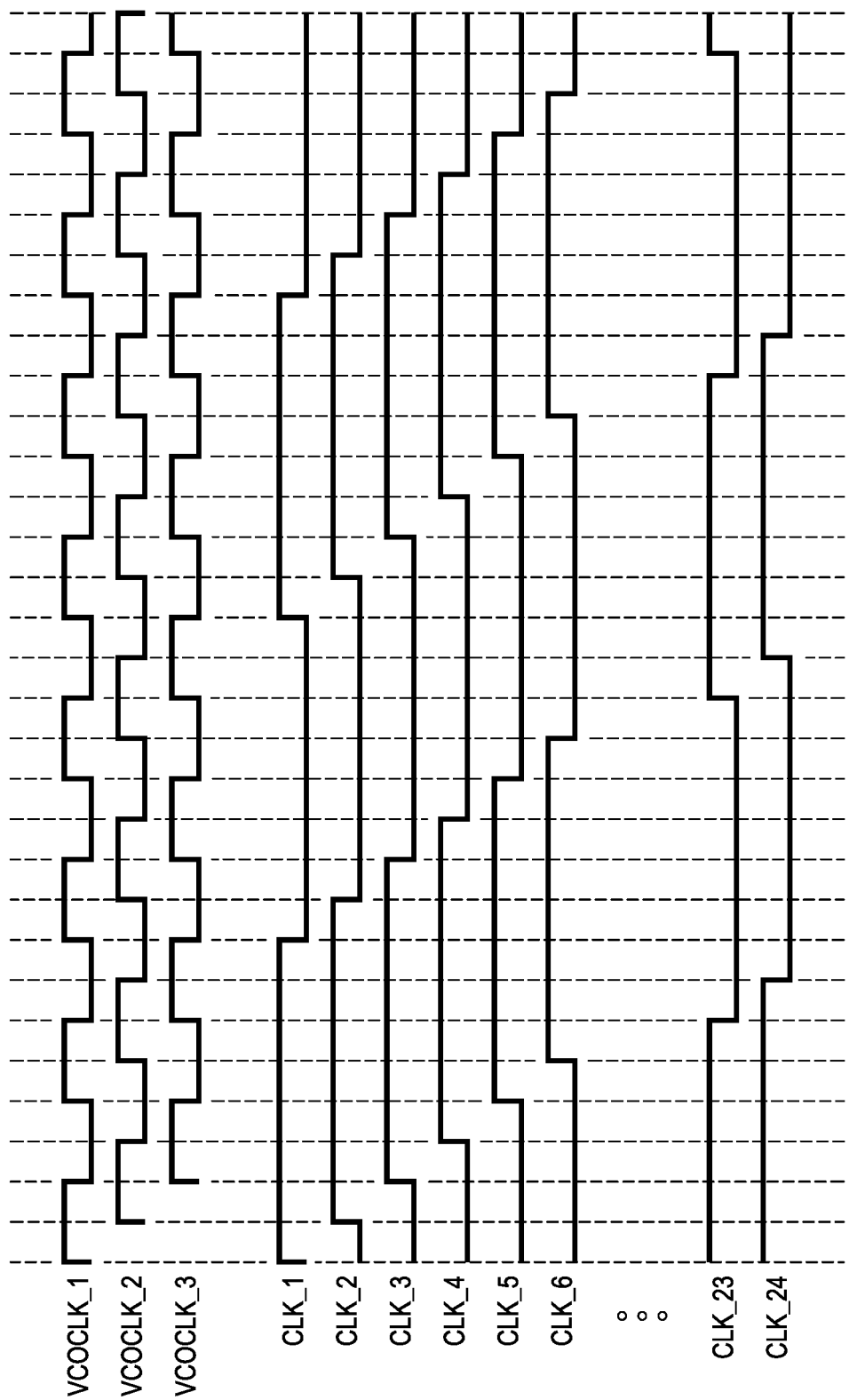
FIG. 6 is a timing diagram illustrating the timing relationship between the input clocks and the larger number of phase-delayed clocks generated using each of the input clocks.

FIG. 6 shows an example timing diagram illustrating the three input clocks to the phase-shifted clock generator 302 (VCO_CLK_1, VCO_CLK_2, VCO_CLK_3) and the corresponding 24 output clocks CLK_1, CLK_2, . . . , CLK_24. The phase-delay between the clocks generated by the phase-shifted clock generator 302 is relatively small (15 degrees in this example) and, as explained below, fine control over the placement of the edges of PWM output 113 can be obtained by using any of the 24 clocks.

Referring back to FIG. 3, the CPU core 102 provides one or more configuration parameters to base pulse generator 310 to cause PWM pulses of PWM output 113 to be generated having a particular pulse width. The base pulse generator 310 generates a base pulse on line 311 that has a width that may differ from the width specified by the CPU core 102. For example, the width of the base pulse may be 100 picoseconds, but the CPU core 102 may request a pulse width of 110 picoseconds. The flip-flops 320 and selection circuit 340 is used to produce a PWM output 113 with the requisite pulse width (e.g., 110 picoseconds). The requested pulse width may be smaller or larger than the pulse width produced by the base pulse generator 310. The base pulse generator 301 is configurable by the CPU core 102 to produce a base pulse on line 311 with a range of pulse widths.

In the case in which the CPU core 102 requests a PWM output 113 having a pulse width that is smaller than the width of the base pulse on line 311, the base pulse generator 310 asserts the control signals CTL1 and CTL2 to operate the multiplexers 342 and 345 to delay the rising edge of PWM output 113 relative to the rising edge of the base pulse. FIG. 7 illustrates a base pulse and a PWM output 113 pulse. The rising edge 710 of the PWM output pulse is time-delayed (TD1) with respect to the rising edge 705 of the base pulse, but the falling edges 715 and 720 are phase-aligned as shown. The delay of the rising edge 710 can be achieved by selection through multiplexer 342 of the particular flip-flop 320 output that is time-delayed by the targeted amount of time delay TD1. The D inputs of each of the flip-flops 320 receives the base pulse from line 311, but each flip-flop is clocked by a different clock from among the 24 phase-delayed clocks CLK_1 through CLK_24. The base pulse generator 310 asserts CTL1 to select the Q output of the flip-flop 320 corresponding to TD1. For example, if TD1 is 100 picoseconds and the time-delay from one clock to the next among clocks 303 is 10 picosecond, then CTL1 is asserted to select the flip-flop 320 output corresponding to CLK_10. CTL2 also is asserted to pass through the output of multiplexer 342 to PWM output 113. The base pulse generator 310 determines the flip-flop 320 to use to generate the corresponding PWM edge based on the programmed pulse width from the CPU core 102. The base pulse generator may include, for example, a mapping between pulse widths and flip-flops 320.

Once the rising edge of the corresponding clock (e.g., CLK_10) occurs, the output of that flip-flop will transition to a logic high state (because the D input is high) thereby forming the rising edge of the PWM output 113. Once the rising edge of PWM output 113 is generated using the correct flip-flop 320, the base pulse generator 310 then changes CTL2 so as to cause multiplexer 345 to select the signal on line 311 to be the output from multiplexer 345. As such, the falling edge 715 of the base pulse is used as the falling edge 720 of PWM output 113 as shown in FIG. 7.

In the case in which the CPU core 102 requests a PWM output 113 having a width that is greater than the width of the base pulse on line 311, the base pulse generator 310 asserts the control signals CTL1 and CTL2 to operate the multiplexers 342 and 345 to use the rising edge of PWM output 113 as the rising edge of PWM output 113 but delay the falling edge. FIG. 8 illustrates a base pulse and a PWM output pulse. The rising edge 810 of the PWM output pulse is used as the rising edge 810 of PWM output 113. That is, the rising edges 805 and 810 are phase-aligned. The falling edge 820 of the base pulse, however, is time-delayed (TD2) with respect to the falling edge 815 of the base pulse. The phase-alignment of the rising edge 810 of PWM output 113 to the rising edge 805 of the base pulse is achieved by selecting the base pulse on the BYPASS line 327 through multiplexer 345. Once the rising edge 805 occurs, the base pulse generator 310 reconfigures the multiplexers to select the flip-flop 320 corresponding to the desired TD2 time delay.

The higher frequency clocks 301 in the disclosed examples are taken from the ring oscillator 208 of a PLL's voltage-controlled oscillator 206. By its very nature, a PLL maintains frequency and phase lock with respect to a reference clock and does so in the face of process, voltage, and temperature (PVT) variations. Thus, because the disclosed examples use clocks derived from a PLL as the higher frequency clocks from which to generate the larger number of lower frequency clocks 303, the higher frequency clocks 301 do not drift with process, voltage, and temperature effects. The examples described herein thus achieve a resolution for the edges of the pulses of the PWM output 113 that varies relatively little, if at all, with process, voltage and temperature. Further, some systems (e.g., systems that are based on the use of delay lines) require calibration to account for changes in phase shift between clocks (which in turn translates into delay inserted in the PWM pulses) due to changes in operating conditions. Delay line systems, for example, require periodic calibration of the delay with operating condition changes. In the disclosed examples, however, as there is no change in phase shift between clocks due to the use of clocks from a PLL, calibration is not required during run-time thereby saving application run-time. Also, only a small portion of the logic (e.g., the counters) is clocked at relatively high frequencies; the rest of the logic is clocked at lower frequencies and thus power consumption is less than it would have been had more of the logic been clocked at the higher frequencies. Further, because the time-location of the rising and/or falling edges of the output PWM pulse is configurable relative to the base PWM pulse by individually clocking the flip-flops 320, the base PWM pulse need not be passed through a delay line to delay the pulse's rising/falling edges, and thus a delay line is not needed.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A circuit, comprising:
a base pulse generator to generate a first pulse width modulated (PWM) pulse;
a first clock generation circuit to generate M clocks of a first frequency, wherein M is an integer;
a second clock generation circuit to receive the M clocks and to generate N clocks each at a second frequency, the second frequeny lower than the first frequency, wherein N is and integer and N is greater than M;
N flip-flops, each of the N flip-flops includes a respective clock input coupled to receive a different one of the N clocks, a respective data input coupled to receive the first PWM pulse, and a respective flip-flop output; and
a selection circuit including a N inputs and a selection circuit output, each of the N inputs is coupled to a corresponding flip-flop output of the N flip-flops, the selection circuit configured to provide, responsive to a control signal, a selected one of the flip-flop outputs as the selection circuit output.

2. The circuit of claim 1, wherein the selection circuit includes N+1 one of the inputs of the selection circuit is coupled to receive the first PWM signal.

3. The circuit of claim 1, wherein the selection circuit comprises a first multiplexer and a second multiplexer, the first multiplexer comprising the plurality of inputs coupled to the corresponding flip-flop outputs, the first multiplexer comprising a first multiplexer output coupled to an input of the second multiplexer, the second multiplexer including another input coupled to receive the first PWM signal.

4. The circuit of claim 3, wherein the base pulse generator is to receive one or more configuration parameters, the one or more configuration parameters to specify timing of rising and falling edges of the selection circuit output.

5. The circuit of claim 4, wherein, responsive to the one or more configuration parameters, the base pulse generator is to assert control signal to the first and second multiplexers to select:
as a rising edge of the selection circuit output, an output from one of the plurality of flip-flops or a rising edge of the first PWM signal; and
as a falling edge of the selection circuit output, a falling edge of the first PWM signal or an output from one of the plurality of flip-flops.

6. The circuit of claim 1, wherein the first clock generation circuit comprises a voltage-controller oscillator.

7. The circuit of claim 6, wherein the voltage-controlled oscillator includes a ring oscillator to generate the M clock signals.

8. The circuit of claim 1, wherein the second clock generation circuit comprises a plurality of frequency dividers.

9. The circuit of claim 1, wherein N is at least twice M.

10. The circuit of claim 1, wherein the second frequency is less than half the first frequency.

11. A system-on-chip (SoC), comprising:
a central processing unit (CPU) core; and
a pulse width modulation (PWM) generator, the PWM generator configured to:
receive a configuration parameter from the CPU core to generate a pulse having a specified pulse width;
generate M clocks from N input clocks, M and N are integers, M is greater than N, and each of the M clocks has a frequency that is lower than a frequency of each of the N input clocks;
generate a plurality of phase-shifted signals, each of the phase-shifted signals generated using a different one of the M clocks; and
assert a control signal to select at least one of the generated phase-shifted signals to generate an output pulse having the specified width.

12. The SoC of claim 11, wherein the PWM generator includes a plurality of flip-flops to generate the plurality of phase-shifted signals, each of the plurality of flip-flops coupled to receive as a clock input a different one of the M clocks.

13. The SoC of claim 11, wherein the PWM generator includes:
a base pulse generator to generate a base pulse;
a selection circuit to select, based on the control signal, either one of the phase-shifted signals or the base pulse as an output from the PWM generator.

14. The SoC of claim 11, wherein M is 3 and N is 24.

15. The SoC of claim 11, wherein the PWM generator includes a plurality of frequency dividers and inverters to generate the M clocks from the N input clocks.

16. The SoC of claim 11, further comprising a ring oscillator to generate the N input clocks.

17. A circuit, comprising:
a base pulse generator to generate a first pulse width modulated (PWM) pulse;
a ring oscillator to generate M clocks of a first frequency;
a second clock generation circuit to receive the M clocks and to generate N clocks each at a second frequency, the second frequency is lower than the first frequency, wherein N and M are integers and N is greater than M;
N flip-flops, each of the N flip-flops includes respective a clock input coupled to receive a different one of the N clocks, a respective data input coupled to receive the first PWM pulse, and a respective flip-flop output; and
a first multiplexer including N inputs, each of the N inputs is coupled to a corresponding flip-flop output; and
a second multiplexer coupled to receive an output from the first multiplexer and the first PWM pulse;
wherein the base pulse generator is configured to assert control signals to the first and second multiplexers.

18. The circuit of claim 17, wherein the base pulse generator is configured to receive one or more configuration parameters, the one or more configuration parameters to specify timing of rising and falling edges of an output from the second multiplexer.

19. The circuit of claim 17, wherein the second clock generation circuit comprises a plurality of frequency dividers.

20. The circuit of claim 19, wherein the second frequency of the N clocks is a fraction of the first frequency of the M clocks based on a divide factor of the frequency dividers.

21. A method, comprising:
generating a first pulse width modulated (PWM) pulse;
generating M clocks of a first frequency, wherein M is an integer;
using the M clocks, generating N clocks, the N clocks are at a second frequency, lower than the first frequency, wherein N is and integer and is greater than M;
selecting, by a selection circuit, an output of N flip-flops, each flip-flop including a respective clock input coupled to receive a different one of the N clocks and including a respective data input coupled to receive the first PWM pulse.

22. The method of claim 21, further comprising receiving one or more configuration parameters specifying timing of rising and falling edges of an output of the selection circuit.

23. The method of claim 21, wherein N is at least twice M, and the second frequency is less than half the first frequency.

\* \* \* \* \*